(12) United States Patent
Woolsey et al.

(10) Patent No.: US 7,515,411 B2
(45) Date of Patent: Apr. 7, 2009

(54) MULTI-FAN AIRFLOW REGULATION FOR FAN FAIL CONDITIONS

(75) Inventors: Terrill Woolsey, Wichita, KS (US); Tanja Smith, Wichita, KS (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 11/673,466

(22) Filed: Feb. 9, 2007

(65) Prior Publication Data

US 2008/0192429 A1   Aug. 14, 2008

(51) Int. Cl.
*H05K 7/20* (2006.01)
*H01L 23/36* (2006.01)

(52) U.S. Cl. .................. 361/695; 361/687; 361/694; 454/184

(58) Field of Classification Search .......... 361/687, 361/690–697, 724–729; 454/184, 185, 195, 454/338, 341; 174/17 VA, 50, 135; 165/80.3, 165/104.33, 122–127, 185; 312/223.2, 223.3, 312/236
See application file for complete search history.

(56) References Cited

U.S. PATENT DOCUMENTS

| | | | | |
|---|---|---|---|---|
| 4,648,007 | A * | 3/1987 | Garner | 361/695 |
| 6,000,623 | A * | 12/1999 | Blatti et al. | 236/49.3 |
| 6,021,042 | A * | 2/2000 | Anderson et al. | 361/695 |
| 6,108,203 | A * | 8/2000 | Dittus et al. | 361/695 |
| 6,502,628 | B1 * | 1/2003 | Siahpolo et al. | 165/122 |
| 6,771,499 | B2 * | 8/2004 | Crippen et al. | 361/687 |
| 6,837,785 | B2 * | 1/2005 | Soderlund | 454/184 |
| 6,936,767 | B2 * | 8/2005 | Kleinecke et al. | 174/50 |
| 6,991,533 | B2 * | 1/2006 | Tsai et al. | 454/184 |
| 7,042,722 | B2 * | 5/2006 | Suzuki et al. | 361/695 |
| 7,209,350 | B2 * | 4/2007 | Merlet et al. | 361/694 |
| 7,247,089 | B2 * | 7/2007 | Crippen et al. | 454/184 |
| 7,259,961 | B2 * | 8/2007 | Lucero et al. | 361/695 |
| 7,344,439 | B2 * | 3/2008 | Henry et al. | 454/184 |
| 7,345,875 | B2 * | 3/2008 | Elkins | 361/695 |
| 2005/0088818 | A1 * | 4/2005 | Chou | 361/695 |
| 2006/0084374 | A1 * | 4/2006 | Cruz et al. | 454/184 |

* cited by examiner

*Primary Examiner*—Michael V Datskovskiy
(74) *Attorney, Agent, or Firm*—North Weber & Baugh LLP

(57) ABSTRACT

Embodiments of the present invention provide a multi-fan cooling system in which redundancy in airflow across a plurality of electrical boards is maintained. This redundancy is provided by having an ability to at least partially divert airflow from a functioning fan to an electrical board for which its corresponding fan has failed. According to various embodiments of the present invention, the multi-fan cooling system comprises two fans located proximate to each other. An airflow plenum couples and distributes air from the two fans across a plurality of electrical boards. In certain embodiments, the plenum comprises stacked outlets that distribute airflow from the two fans across the plurality of electrical boards. During normal operation, this airflow is approximately evenly distributed across the electrical boards. However, if one of the fans fails, the plenum causes air from the single operating fan to still be distributed across the plurality of electrical boards. In one embodiment of the invention, the plenum includes a flap that covers an opening for the failed fan to prevent recirculation of airflow back into the failed fan.

18 Claims, 5 Drawing Sheets

MULTI-FAN AIRFLOW REGULATION FOR FAN FAIL CONDITIONS

BACKGROUND

A. Technical Field

The present invention relates to electrical cooling systems, and more particularly, to the control and redundancy of airflow across a plurality of electrical boards and components thereon.

B. Background of the Invention

Heat dissipation devices and technologies are well known in the art and oftentimes critical to the functioning of electrical systems. For example, heat dissipation systems, such as fan systems, are being deployed within storage systems in order to maintain electrical boards, and the components thereon, within a preferred temperature range.

As a result of improvements in semiconductor design and manufacturing, electrical systems, such as controller and processing systems, are able to process large amounts of data at relatively higher clock rates. The electrical components within these systems can generate a large amount of heat, which needs to be dissipated away from these components in order for them to maintain a preferred temperature range in which these components function properly.

The component density and size of electrical systems, and large amount of heat generated by components within these systems, has and continues to affect the cooling systems used to dissipate this heat. For example, certain complex electrical systems may present problems for cooling systems because of the board shape on which the system is located or the component locations on the board. Issues, such as maintaining an appropriate level of airflow or redundancy within the cooling system, may require that a cooling system meet certain performance standards as well as size requirements so that it can properly cool its corresponding electrical system.

One skilled in the art will recognize the potential damage caused by overheating electrical components, such integrated chips. Electrical components, such as for example a processor, can often generate large amounts of heat during normal operation. This heat may damage the processor, as well as components around the processor, and result in instability or failure of the system in which the processor is located. It is therefore very important that the cooling system effectively dissipate this heat away from heat-generating components and that this dissipation process have a level of redundancy to ensure its reliability.

Cooling systems come in various shapes and sizes, and may contain numerous different components. For example, cooling systems may comprise different heat dissipating elements such as fins, fans, heat exchangers, heat sinks and radiators, and water jackets. In the case of cooling fan systems, a fan may is used to create airflow across one or more electrical components to transport heat away from the components generating the heat. Cooling fan systems may be used in conjunction with other heat dissipating elements depending on the design and implementation of the system.

These cooling fan systems may employ multiple fans within the system. The location and control of such multi-fan systems is crucial to providing the most effective heat dissipation across an electrical board or boards. Space constraints and airflow are often significant issues that need to be addressed when designing a cooling system for a corresponding electrical system.

The proper maintenance of temperature within an electrical system box (e.g., a storage controller box) may present difficulties in maintaining consistent means for dissipating the heat generated therein. A cooling system is often required to operate in a very confined space, provide sufficient airflow across the controller board, and have failover redundancy in case a component in the cooling system fails. In typical prior art embodiments, a fan provided airflow across a single controller board. Airflow from the fan dissipated heat generated from electrical components on the board in order to maintain a preferred operating temperature within the controller box and/or electrical components therein. If the fan failed, a failure message was generated so that the fan may be replaced within the system. These prior systems were generally less sensitive to heat and/or operated at a lower temperature so that the time required to recognize and correct a failed fan typically did not damage the electrical system or components.

Electrical systems, such as controller boards, have become more sensitive to heat and may operate at higher temperature levels. As a result, there is not a time buffer that allows for manually replacing a fan when it fails. In these newer systems, if a failed fan is not immediately replaced, components within the system may be damaged. For example, many controllers operate at relatively higher power levels and clock speeds, which continually generate large amounts of heat that require uninterrupted airflow to reduce this heat. If this airflow is interrupted for a brief period of time, components within the controller system may be damaged.

Accordingly, what is desired is systems, devices and methods that address the above-described concerns.

SUMMARY OF THE INVENTION

Embodiments of the present invention provide a multi-fan cooling system in which redundancy in airflow across a plurality of electrical boards is maintained. This redundancy is provided by having an ability to at least partially divert airflow from a functioning fan to an electrical board for which its corresponding fan has failed. According to various embodiments of the present invention, the multi-fan cooling system comprises two fans located proximate to each other. An airflow plenum couples and distributes air from the two fans across a plurality of electrical boards. In certain embodiments, the plenum comprises stacked outlets that distribute airflow from the two fans across the plurality of electrical boards. During normal operation, this airflow is approximately evenly distributed across the electrical boards. However, if one of the fans fails, the plenum causes air from the single operating fan to still be distributed across the plurality of electrical boards. In one embodiment of the invention, the plenum includes a flap that covers an opening for the failed fan to prevent recirculation of airflow back into the failed fan.

In various embodiments of the invention, the plenum comprises two stacked outlets, a ridge located between the two outlets, and a flap positioned between two fan openings from which air is provided into the plenum. In certain embodiments, the stacked outlets and fan openings are approximately the same shape but rotated ninety degrees relative to each other. If one of the fans should fail, the flap collapses over the opening corresponding to the failed fan to prevent recirculation of airflow back into the failed fan.

The ridge is designed to distribute airflow between the two outlets and may be adjusted to change this distribution according to desired performance parameters and the environment in which the cooling system is functioning. For example, in one embodiment of the invention, the ridge is distanced from the output of the fans to result in an equilateral triangle so that airflow is approximately evenly distributed between the two outlets.

In various embodiments of the invention, the flap may function as a passive flap that is sucked over the failed fan when airflow from the failed fan disappears. Basically, an initial backflow of air caused by the fan failure results in the flap covering the failed fan and being held in location by suction. In other embodiments of the invention, the flap may be an actively controlled component in which a failed fan is detected and electronically controlled and positioned over the failed fan. In yet other embodiments of the invention, a rigid vane located between the fan openings causes a siphoning effect on the opening of a failed fan which would effectively prohibit backflow into the failed fan and may result in air actually flowing into the plenum from the failed fan.

One skilled in the art will recognize that other characteristics of the plenum may be modified to change the airflow from the fans to the electrical boards. Furthermore, the structure of the ridge, vane and the flap may be adjusted to realize certain other functionality relative to its operation within the cooling system.

The multi-fan cooling system may be located within a power module and interfaced within an electrical system box, such as a controller box. In certain embodiments, the power module may take the AC current from the electrical system and convert it into a DC current to drive electrical components with in the system as well as the cooling system itself.

Other objects, features and advantages of the invention will be apparent from the drawings, and from the detailed description that follows below.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

Figure ("FIG.") 1 illustrates a perspective view of a multi-fan cooling system in accordance with various embodiments of the present invention.

DETAILED DESCRIPTION OF THE PREFERRED EMBODIMENTS

A multi-fan cooling system is described having redundant airflow to protect against a fan failure condition damaging heat-generating components within a corresponding electrical system. Embodiments of the present invention provide an airflow plenum that may be used to connect with an electrical system box and distribute airflow over electrical boards within the box in order to dissipate heat. In the event of a fan failure within the system, the apparatus diverts airflow from a remaining operational fan to at least partially compensate for the lost airflow caused by the failed fan.

In the following description, for purpose of explanation, specific details are set forth in order to provide an understanding of the invention. It will be apparent, however, to one skilled in the art that the invention may be practiced without these details. One skilled in the art will recognize that embodiments of the present invention, some of which are described below, may be incorporated into a number of different computing systems and devices including a storage controller box.

Reference in the specification to "one embodiment" or "an embodiment" means that a particular feature, structure, characteristic, or function described in connection with the embodiment is included in at least one embodiment of the invention.

Figure 1:
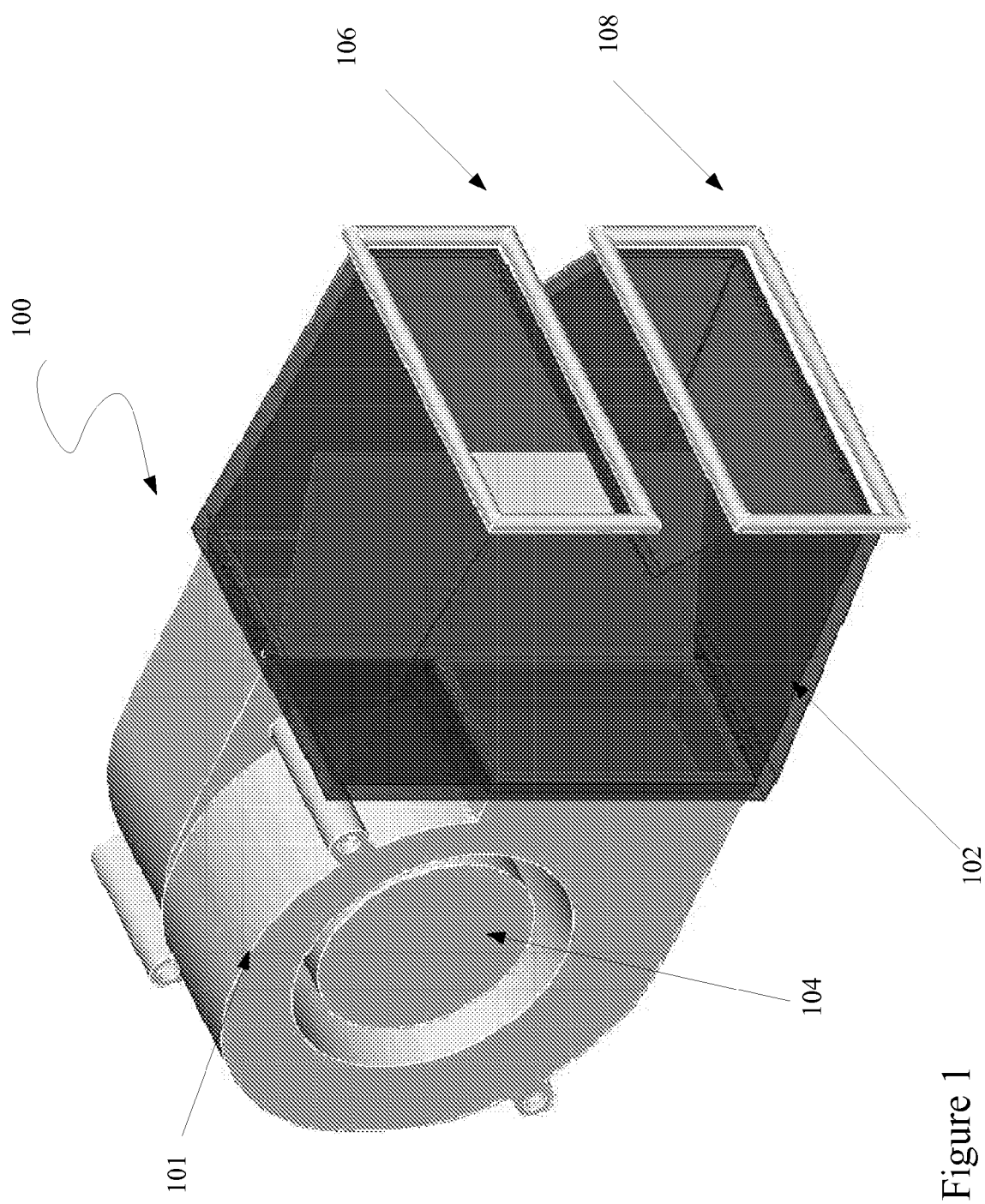

FIG. 1 illustrates a multi-fan cooling system according to various embodiments of the invention. The cooling system 100 comprises a plurality of fans 101, at least one intake inlet 104 that allows the fans to suck air into the system, and a plenum 102. The plenum 102 internally comprises a ridge or other structure the divides airflow across two outlets 106, 108 through which the airflow is provided over one or more electrical systems. Although FIG. 1 illustrates a cooling system having two fans, one skilled in the art will recognize that any plurality of fans may be employed within the scope of the present invention.

In the embodiment shown in FIG. 1, the plenum 102 provides a conduit through which air flows and is distributed to two electronic boards. The length, width and other design features of the plenum 102 may be modified to change the characteristics of this airflow and air distribution. Additionally, the shape of the outlets 106, 108 may be modified to change the characteristics of the airflow from the particular outlet.

The cooling system 100 operates by having its plurality of fans 101 receive air through its at least one intake inlet 104 and force the air through a plurality of openings into the plenum. The plenum 102 distributes this air out of its two outlets 106, 108 and into the electrical system or systems. The distribution of air through the outlets 106, 108 depends on the shape of the ridge or other structure between the outlets, the width and length of the plenum, and other factors known to one of skill in the art.

According to various embodiments of the invention, the plenum 102 also comprises an internal flap that can cover one of the fan openings. If one of the fans within the cooling system 100 should fail, the flap closes the failed fan's opening into the plenum to prevent back-flow into the failed fan. The remaining operational fan or fans will continue to provide airflow into the plenum 102, which will be distributed across both electronic boards. This response to a failed fan results in redundancy within the cooling system to avoid damaging electrical components caused by overheating.

Figure 2A:
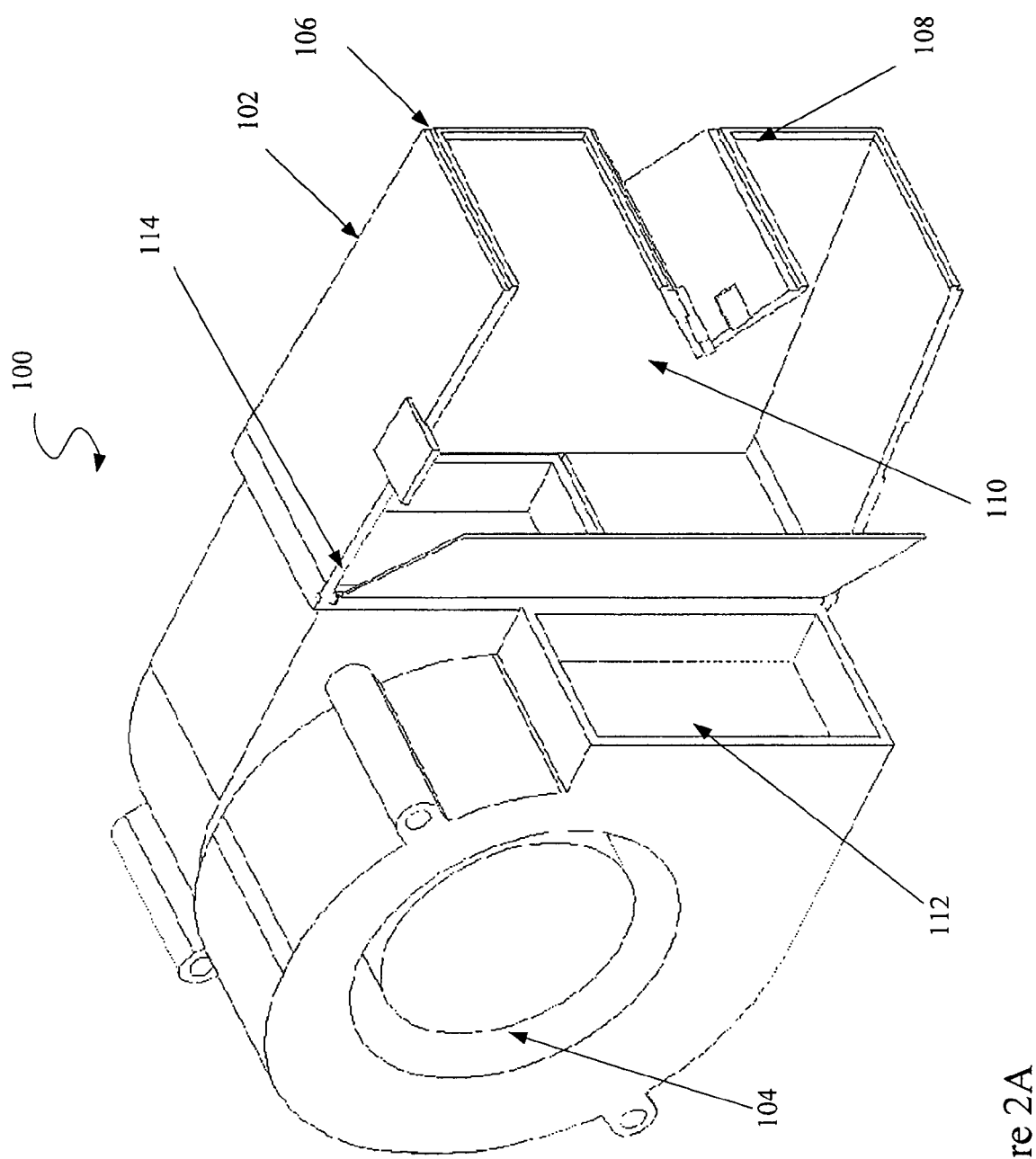
FIG. 2A illustrates a cross sectional view of the outlets of the plenum showing the certain structural features within the plenum according to various embodiments of the present invention.

FIG. 2A illustrates a cross sectional view of a cooling system 100 according to various embodiments of the invention. As previously discussed, the cooling system 100 includes a plurality of fans, an air intake inlet 104, multiple fan openings including fan opening 112 that interfaces with a plenum 106 which functions as a conduit for air from the fan opening 112 to an electrical system. The plenum 102 includes stacked outlets 106, 108 and a ridge 110 that distributes air between the outlets 106, 108. The plenum 102 also comprises a flap 114 that covers the fan opening 112 in the event that its corresponding fan fails in order to prevent backflow of air into the failed fan.

One skilled in the art will recognize that the plenum housing may be designed in accordance with a number of different factors that enable airflow between the plurality of fans and one or more electrical systems. For example, the distance between the fan openings and the plenum outlets 106, 108 may be changed to adjust the distribution and other characteristics of airflow through the outlets 106, 108. Additionally, the shape of the plenum may be modified to adjust airflow, including changing the shape of the ridge 110, or other element between the outlets, to affect the distribution of airflow out of the outlets 106, 108.

During normal operation of the cooling system 100, airflow from the plurality of fans is balanced to provide even distribution or approximately even distribution to each of the outlets 106, 108. This distribution may be modified by changing the ridge 110 or shape of the plenum 102 to distribute more airflow out of one of the outlets 106, 108. According to certain embodiments of the invention, a flap 114 is positioned within plenum 102 and is triggered in the event of a failed fan.

The flap 114 within the plenum functions to block airflow back into an opening of a failed fan. According to various embodiments of the invention, the flap 114 is a passive element that uses air pressure created by the failed fan to cover the opening within the plenum 102 to the failed fan. In other embodiments of the invention, the flap 114 is an actively controlled element in which circuitry detects a fan failure and electronically controls the flap to cover the opening to the failed fan. In both of these scenarios, the remaining operational fan or fans is able to at least partially compensate for the failed fan because of the distribution of airflow out of the plenum outlets 106, 108.

Figure 2B:
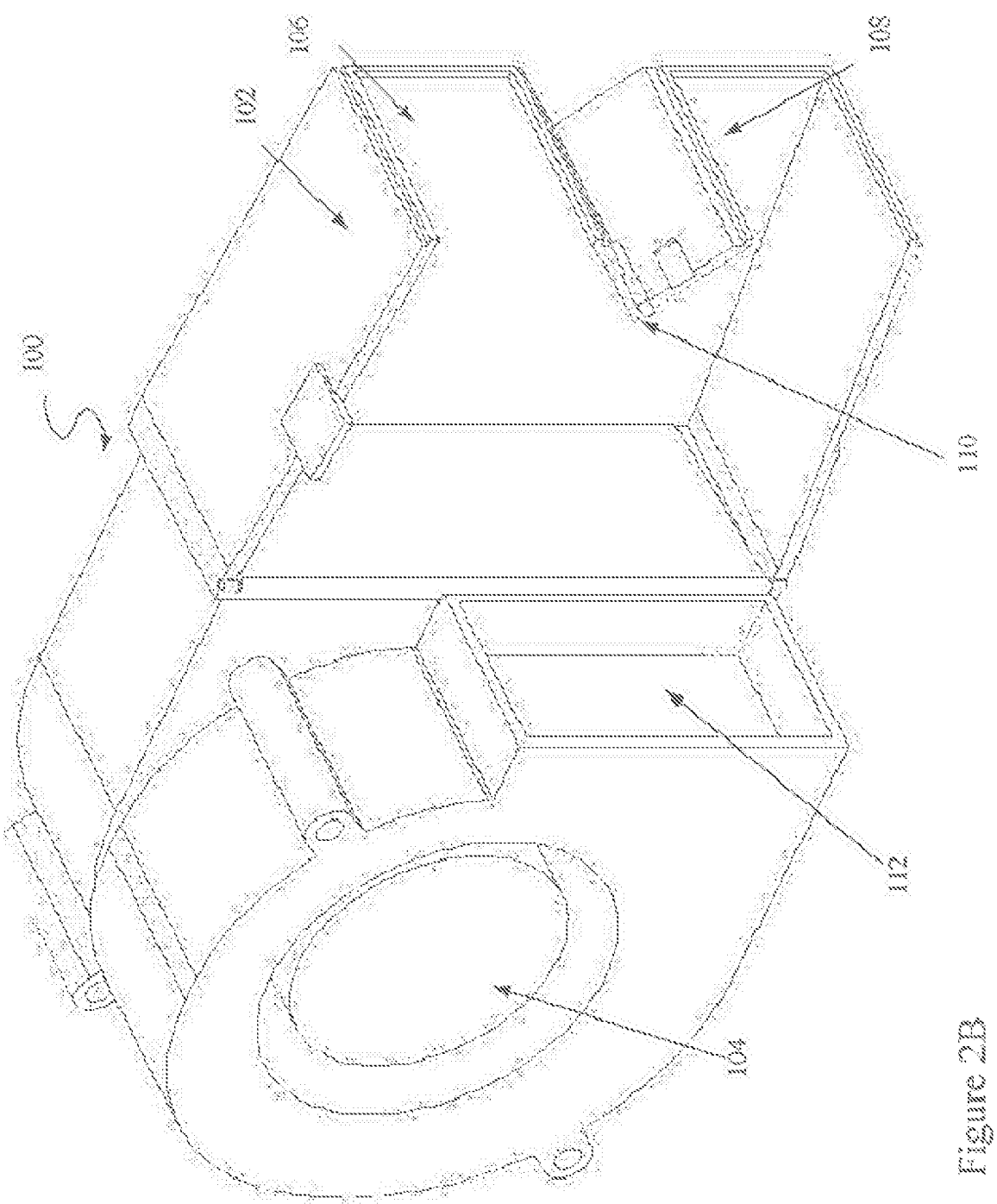
FIG. 2B illustrates a cross sectional view of the outlets of the plenum showing the certain structural features within the plenum according to various other embodiments of the present invention.

FIG. 2B illustrates a cross sectional view of a cooling system 100 in which a flap is not used to cover an opening in the plenum of a failed fan according to various embodiments of the invention. Backflow into a failed fan is prevented by creating a siphoning effect on the opening 112 of the failed fan that minimizes the amount of air re-circulating back into the failed fan.

A rigid vane may be adapted between two of the fan openings in the plenum 102. In this embodiment of the present invention, the plenum 102 is designed and constructed so that the siphoning effect is being created through the failed fan's opening into the plenum 102. In the event of the fan failure, the rigid vane results in suction into the plenum 102 from the failed fan because of the airflow generated by the remaining operational fan. As a result, the failed fan opening does not create backflow into the failed fan, but rather potentially generates a small amount of airflow into the plenum 102.

The design of the plenum 102 may be optimized to fit various types of electrical boxes, systems and operating environments. Curvatures may be introduced into the plenum 102 to provide a particular air conduit or create a desired airflow effect. The plenum outlets 106, 108 may be shaped to provide a particular airflow across a board.

Figure 3:
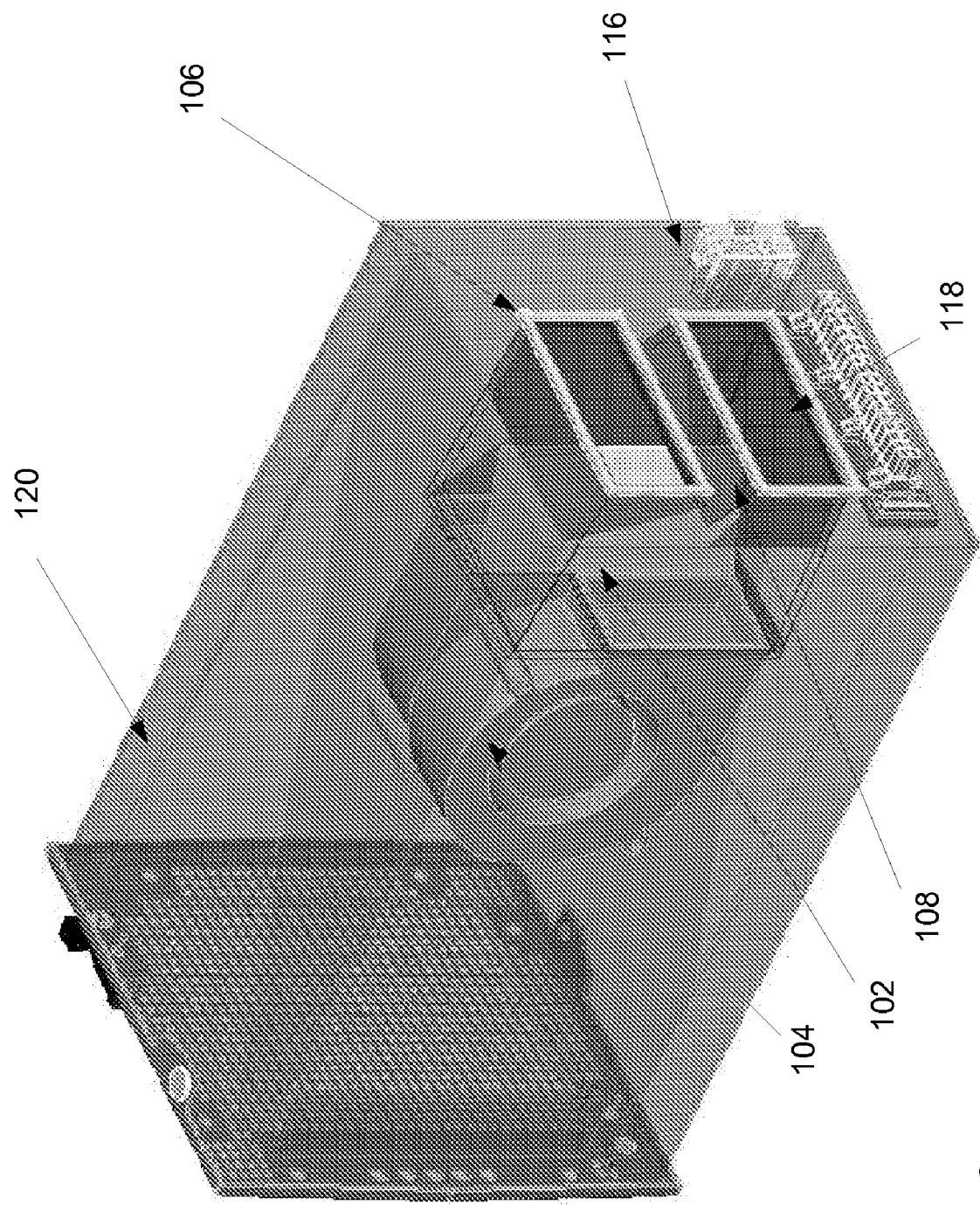
FIG. 3 shows a perspective view of the placement of a multi-fan twin cooling system in a power module according to various embodiments of the present invention.

FIG. 3 illustrates a cooling system which is inserted into a module, such as a power module, that couples directly to an electrical system box according to various embodiments of the invention. The module includes a housing 120 which may have a grating on one or more sides to allow air to flow into the module housing. The cooling system is coupled within the housing 120 such that the cooling system outlets 106, 108 can provide airflow across one or more electrical system external to the module. A plurality of fans is coupled within the housing 120, which take air through one or more intake inlets 104 and force the air into the plenum 102. The plenum distributes the airflow between the two outlets 106, 108 which cools electrical components in the electrical system or systems.

The housing 120 may have certain electrical interfaces that electrically couple the module, including the cooling system, to an electrical system box or boxes. For example, as illustrated in FIG. 3, a first connector 118 may connect electrical control data between the module and the electrical system. A second connector 116 may be used to interface with the power system to drive the operation of the fans within the cooling system.

In certain embodiments of the invention, the cooling system is electrically connected to the electrical system for which it is providing airflow through connectors 116 and 118. The electrical system provides AC power to the module 120 (e.g., power module) through the vertical connector 116 provided on the bottom right of the module 120. The module 120 converts the AC current into a DC current that supplies certain electrical components power. This DC current may also be used to drive the cooling system, including the fans therein, and may be received through the horizontal electrical connector 118.

Figure 4:
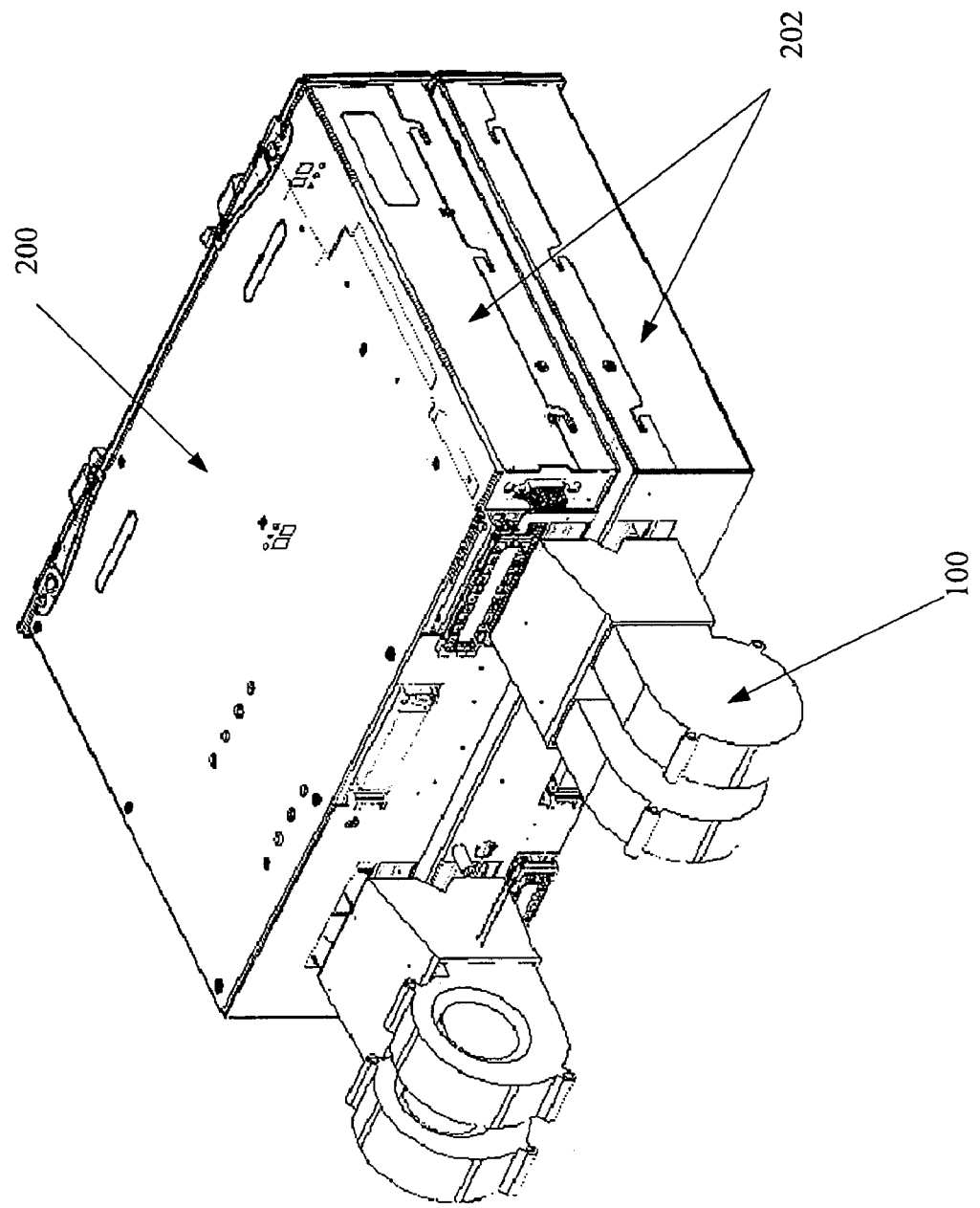
FIG. 4 shows multi-fan cooling systems coupled to a housing of an electrical system or electrical systems according to various embodiments of the present invention.

FIG. 4 illustrates an exemplary configuration in which the cooling system 100 is coupled to a box containing an electrical system. Referring to FIG. 4, the cooling system 100 provides airflow within the electrical system box 200 such as a controller box that contains electronic boards and heat generating electronic components thereon. In this particular example, the electrical system box 200 includes two stacked electronic boards that contain various heat-generating elements. The cooling system 100 must provide sufficient airflow across both boards in order to ensure that a preferred temperature range is maintained. As shown, other cooling systems may also be coupled to the electrical system box 200 to provide additional airflow.

It is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded that broadest interpretation so as to encompass all such modifications and similar structures.

We claim:

1. A cooling system for maintaining a temperature within an electrical system below a preferred threshold, the system comprising:
    a housing having a plurality of air outlets from which airflow is provided to at least one electrical system;
    a plurality of fans, coupled within the housing, that generate airflow through a plurality of fan openings;
    a plenum, coupled between the plurality of fan openings and the plurality of air outlets, that control airflow between the plurality of fans and the at least one electrical system;
    wherein airflow redundancy is realized by a structure located between the plurality of air outlets that distributes airflow from the plurality of fans across the plurality of air outlets; and
    wherein the cooling system is contained within a power module that converts an AC current to a DC current which drives the plurality of fans and provides power to the at least one electrical system.

2. The cooling system of claim 1 wherein the structure located between the plurality of air outlets comprises a rigid vane that creates a siphoning affect on a first fan opening if its corresponding fan, within the plurality of fans, should fail in order to minimize air backflow into the failed fan.

3. The cooling system of claim 1 further comprising a flap, located between the plurality of fan openings, that covers a second fan opening if its corresponding fan, within the plurality of fans, should fail in order to minimize air backflow into the failed fan.

4. The cooling system of claim 3 wherein the flap is a passive element that is controlled by suction generated by the failed fan.

5. The cooling system of claim 3 wherein the flap is an active element controlled by electrical circuitry that detects a failed fan, within the plurality of fans, and causes the flap to cover the failed fan's opening.

6. The cooling system of claim 1 wherein the at least one electrical system comprises a plurality of stacked controller boards within a storage controller box.

7. The cooling system of claim 1 wherein the structure located between the plurality of air outlets is a triangular-shaped ridge.

8. The cooling system of claim 7 wherein the structure evenly distributes airflow from the plurality of fans across the plurality of air outlets.

9. The cooling system of claim 1 wherein the plurality of air outlets are similar in shape to the plurality of fan openings and rotated ninety degrees from each other.

10. A plenum for distributing airflow from at least two fans to at least two electrical boards, the plenum comprising:
  a housing that provides a conduit through which airflow from the at least to fans can reach the at least two electrical boards;
  at least two fan openings on the housing that allow airflow from the at least two fans to enter the plenum;
  at least two air outlets on the housing that allow airflow within the plenum to reach the at least two electrical boards;
  a ridge structure, located internally within the housing and between the at least two air outlets, that distributes the airflow within the plenum between the at least two air outlets; and
  wherein the cooling system is contained within a power module that converts an AC current to a DC current which drives the plurality of fans and provides power to the at least one electrical system.

11. The plenum of claim 10 wherein the ridge structure comprises a rigid vane that creates a siphoning effect on a first fan opening, within the at least two fan openings, to reduce air flow back into a failed fan coupled to the first fan opening.

12. The plenum of claim 10 further comprising a flap, coupled between the at least two fan openings, that covers a second fan opening, within that at least two fan openings, to block air flowing back into a failed fan coupled to the second fan opening.

13. The plenum of claim 10 wherein the ridge structure defines an equilateral triangle with the at least two fan openings.

14. The plenum of claim 13 wherein the airflow out of the at least two air outlets is evenly distributed.

15. A method for providing redundant airflow across two electrical boards, the method comprising:
  converting an AC current to a DC current which drives a plurality of fans and provides power to a plurality of electrical boards, the conversion step occurring within a power module associated with the plurality of fans and the plurality of electrical boards;
  receiving airflow from at least one fan, within the plurality of fans having at least one failed fan, within a confined structure that connects to a plurality of electrical boards;
  dividing the airflow from the at least one fan through a plurality of outlets on the confined structure so at least two electrical boards, within the plurality of electrical boards, each receive a portion of the airflow; and
  blocking airflow recirculation back into the at least one failed fan in order to maximize airflow through the two outlets.

16. The method of claim 15 wherein the airflow is divided using a structure located on an internal wall of the confined structure.

17. The method of claim 15 wherein the airflow recirculation is blocked by creating a siphoning effect on an opening to the at least one failed fan.

18. The method of claim 15 wherein the airflow recirculation is blocked by covering an opening to the at least one failed fan.

* * * * *